US012503756B2

(12) United States Patent
Jaroš et al.

(10) Patent No.: US 12,503,756 B2
(45) Date of Patent: Dec. 23, 2025

(54) APPARATUS AND METHOD FOR COATING THE INNER SURFACE OF A HOLLOW ARTICLE

(71) Applicant: PLASMATERIA GMBH, Vienna (AT)

(72) Inventors: Martin Jaroš, Vienna (AT); Bernhard Kohlhauser, Vienna (AT)

(73) Assignee: PLASMATERIA GMBH, Vienna (AT)

( * ) Notice: Subject to any disclaimer, the term of this patent is extended or adjusted under 35 U.S.C. 154(b) by 147 days.

(21) Appl. No.: 18/562,259

(22) PCT Filed: Jun. 8, 2022

(86) PCT No.: PCT/AT2022/060188
§ 371 (c)(1),
(2) Date: Nov. 17, 2023

(87) PCT Pub. No.: WO2022/261684
PCT Pub. Date: Dec. 22, 2022

(65) Prior Publication Data
US 2025/0092505 A1 Mar. 20, 2025

(30) Foreign Application Priority Data
Jun. 16, 2021 (AT) .............................. A 60170/2021

(51) Int. Cl.
*C23C 14/32* (2006.01)
*C23C 14/04* (2006.01)
*H01J 37/32* (2006.01)

(52) U.S. Cl.
CPC .......... *C23C 14/046* (2013.01); *C23C 14/042* (2013.01); *C23C 14/32* (2013.01);
(Continued)

(58) Field of Classification Search
CPC ..... C23C 14/046; C23C 14/042; C23C 14/32; C23C 14/228; C23C 14/24;
(Continued)

(56) References Cited

U.S. PATENT DOCUMENTS

2015/0101924 A1 4/2015 Weaver et al.

FOREIGN PATENT DOCUMENTS

DE 19804838 A1 8/1999
GB 1482219 A 8/1977
JP H06108238 A 4/1994

*Primary Examiner* — Rodney G Mcdonald
(74) *Attorney, Agent, or Firm* — NGUYEN TARBET IP LAW

(57) ABSTRACT

The invention relates to an apparatus for forming a coating on and/or modifying the properties of the inner surface of a hollow article (1), wherein the apparatus comprises a plasma source (2), the plasma source (2) having an elongate shape and comprising a cathode (3) as well as a target (4), wherein the target (4) is a thermionic electron emission source, wherein the target (4) is connected to the cathode (3) in an electrically conductive manner, wherein the plasma source (2) further comprises a masking (5) which partially covers the outer surface of the cathode (3) and the target (4), and which masking (5) is adapted to prevent the formation of plasma on an area covered by the masking (5) during operation of the apparatus, wherein a plasma formation area (6) is provided on the target (4), which plasma formation area (6) is not covered by the masking (5). The invention further relates to a target (4), an arrangement of the apparatus, a method, as well as a hollow article (1).

19 Claims, 2 Drawing Sheets

(52) U.S. Cl.
CPC .. *H01J 37/32394* (2013.01); *H01J 37/32541* (2013.01); *H01J 37/32568* (2013.01); *H01J 37/32596* (2013.01); *H01J 37/32623* (2013.01)

(58) Field of Classification Search
CPC .......... H01J 37/32394; H01J 37/32541; H01J 37/32568; H01J 37/32596; H01J 37/32623
See application file for complete search history.

Section A A

APPARATUS AND METHOD FOR COATING THE INNER SURFACE OF A HOLLOW ARTICLE

The present invention relates to an apparatus for forming a coating on and/or modifying the properties of the inner surface of a hollow article. The invention further relates to a target for use in such apparatus, the arrangement of such apparatus with a hollow article, a method, as well as a hollow article.

The manufacturing of coatings inside cavities and on internal surfaces of workpieces is an industrially highly relevant process. Coatings on such internal surfaces may be required for example to increase the wear-, fatigue-, oxidation-, and/or corrosion-resistance of the surface. Common applications that require enhanced surface properties on internal surfaces are pipes, barrels, housings, valves, shock absorbers, hydraulic actuators, forming tools, forming equipment, nozzles, tanks, and heat exchangers.

In many cases, such coatings are produced by electrochemical or chemical processes like chrome plating. The drawback of these technologies is their dependence on many chemicals that pose significant safety-, health- and environmental risks. In particular, the most common coating on internal surfaces is a coating based on metallic chromium which is usually derived from carcinogenic Cr (VI) compounds.

Due to legislative restriction of these types of chemicals various alternative techniques are known. Those include laser beam evaporation, gas spraying, soldering processes, an explosive evaporation, or a plasma technique based on hollow cathode discharge with gaseous precursors.

Another conventionally applied method to produce coatings on internal surfaces is Chemical Vapor Deposition (CVD), but this technique requires high process temperatures which are not suitable for many component materials.

A typical industrially applied method to produce coatings on components is Physical Vapor Deposition (PVD). Physical Vapor Deposition processes can be realized in several different techniques which include sputtering, cathodic arc evaporation, thermal evaporation, or electron beam evaporation. A common setup to realize Physical Vapor Deposition processes is to place substrates (e.g., workpieces such as tools or components) onto a substrate holder which is later on introduced into a vacuum chamber and rotated or moved in front of a coating source (often also referred to as plasma source). Typically, the coating source is integrated into the walls, ceiling, or bottom of the vacuum chamber. The major disadvantage of such industrially applied Physical Vapor Deposition techniques is that they are line-of-sight-based processes and therefore are not capable of depositing coatings inside cavities having a significant depth.

Therefore, none of the mentioned techniques fully meets the industry requirements for low cost, robustness, process temperature, versatility, coating properties, workpiece dimensions, or they are not suitable due to their health and environmental risks.

An object of the present invention can therefore be seen in overcoming at least one of the above-mentioned disadvantages of the prior art. A particular object of the invention can be seen in providing an apparatus and/or a method being suitable for the economic deposition of coating materials on the inner surface of a hollow article. Preferably, the deposition process of the invention should be carried out in a controlled and spatially defined manner. Additional objects of the invention may be seen in providing a new industrial-friendly solution for a technique for manufacturing coating inside cavities and internal surface of a hollow article.

At least one of the above objects can be solved by the present invention.

According to the invention, a plasma source may be provided that can reach inside cavities and/or deflect a flux of coating material into cavities of a hollow article. Furthermore, a method may be provided to facilitate the deposition process of material on the inner surface of a hollow article.

In the context of the present invention, a hollow article may be any article that comprises an inner surface. Examples of hollow articles are tubes, pipes, hollow shafts, or the like. The inner surface of the hollow article may in particular be a surface of an opening that extends into the hollow article. Non-limiting examples for internal surfaces are inner surfaces of boreholes, or those surfaces extending along the inner diameter surfaces of pipes, tubes, hollow shafts, or the like.

The apparatus of the invention comprises a plasma source which may comprise a cathode and a target. One purpose of the cathode is to deliver plasma near to a targeted area on the inner surface of a hollow article.

According to the invention, the apparatus may further comprise a masking, which partially covers the outer surface of the cathode and the target. One purpose of the masking is to eliminate any unwanted parasitic discharges around the cathode and the target. Therefore, the masking may be beneficial for the confined formation of plasma, leading to a well-defined material deposition.

The plasma source of the inventive apparatus may be connected to a power supply unit. The power supply unit may particularly be adapted to supply electrical energy to the plasma source. The power supply unit may particularly be adapted to supply direct current and pulsed current to the plasma source and/or it may comprise a control unit, which is adapted to control the current being supplied to the plasma source.

In one embodiment, the geometry and the properties of the target and the cathode are not particularly limited, as long as target and cathode are suitable for forming a plasma. In particular, the target should be adapted to be a thermionic emission source. The cathode and the target may be formed as one integral part, being manufactured of the same material. Alternately, the target and the cathode may be separate parts which are connected in an electrically conductive manner. In the latter case, the materials of target and cathode may be different.

It may be provided that the masking partially covers the outer surface of the cathode and/or the target. In particular, the masking can prevent plasma from being formed on areas of the cathode and the target, which are covered by the masking.

It may be provided that a certain area of the target is not covered by the masking. This area may be referred to as plasma formation area. Plasma may therefore solely be formed in plasma formation area.

The plasma source may therefore comprise at least a cathode, a target, and a masking. In order to be introducible into a hollow article, the plasma source can have an elongate shape. In the context of the present invention the term "elongate shape" may particularly refer to the ratio between diameter of the plasma source and length of the plasma source being lower than 1:5, such as lower than 1:8, or lower than 1:10.

The masking may be made out of either nonconductive or conductive material. In case the masking being made out of nonconductive material the masking device can be freely placed around the cathode and the target. The masking may, but does not have to be, in direct contact with the outer surface of the cathode and the target. In case that the masking device is made out of conductive material the masking device needs to be placed around the cathode as close as possible without the masking and the outer surface of the cathode and the target being in electrical contact.

In general, the shape of the plasma source can be adapted to the diameter and size of the inner surface to be treated. For insertion into the hollow article, the outer diameter of the plasma source needs to be smaller than the inner diameter of the hollow article to be treated. In case of placement of the plasma source being arranged in front of the cavity, the plasma source may have an opening of similar size than the cavity.

The length of the plasma source may be as long as is needed for the inner surface to be treated completely.

The cathode is preferably made of a high melting point material. The cathode may comprise one or more materials/elements from the following list: hafnium, molybdenum, niobium, tantalum, tungsten, titanium nitride, zirconium nitride, hafnium nitride, graphite.

The target may particularly be intended as the source of evaporated material which condensates on the inner surface of the hollow article. Therefore, the material of the target may be adapted to the nature of desired coating. When using a target for material deposition or plasma treatment the target can optionally be placed or extend outside the masking. Plasma formation and material evaporation from the target may be achieved by maintaining a high temperature at the surface of the target, in particular in the plasma formation area.

In a particular aspect, the invention may relate to a target itself, or in a target for use in an apparatus of the invention. The invention may also relate to the use of a target in an apparatus of the invention.

Such target may be adapted to be connected to the cathode of an apparatus of the invention. Such connection can for example be achieved by a positive-locking connection, such a plug connection or a threaded connection. The target may therefore comprise a connection part, being adapted to establish a connection with the cathode. In this way, the same apparatus may be equipped with different targets. The target may for example have a hollow shape.

The target may comprise one or more materials/elements from the following list: aluminum, boron, carbon, chromium, cobalt, copper, gold, holmium, iron, lanthanum, lithium, magnesium, manganese, molybdenum, nickel, silicon, silver, tin, titanium, vanadium, ytterbium, yttrium, zinc, zirconium, alloys thereof.

The plasma formation area may be formed on the target of the plasma source. In a preferred embodiment, the free end of the target also accommodates the plasma formation area. For example, in case the target having a hollow cylindrical shape, the plasma formation area may comprise a ring-shape portion, being formed of one base of the cylinder. In case the target not being covered by the masking on its full length, the plasma formation area may additionally comprise part of the target's lateral surface.

The apparatus of the invention may further comprise a gas supply channel. The gas supply channel may particularly be a channel being positioned in the interior and/or in the central part of the plasma source. The plasma source may further comprise a gas outlet of the gas supply channel. The gas outlet may particularly be positioned in the plasma formation area.

The gas supply may be useful to achieve active cooling of the target, which may be necessary due to the elongate geometry of the plasma source. The gas provided via the gas supply channel may be beneficial in maintaining the plasma only at the free end of the target. This may result in elevated pressures at the free end of the plasma source which preferentially concentrates the plasma discharge in the high pressure area.

The gas supply channel may also be used to supply reactive gas to the coating site, in order to influence the coating composition and/or the material properties of the coating.

The apparatus of the invention may further comprise a vacuum chamber, which is adapted to accommodate at least part of the hollow article to be coated and the plasma source.

Additionally, the apparatus may be equipped with a temperature control system adapted to control the temperature of the hollow article. Thereby, the desirable temperature for optimal coating properties without overheating or negatively influencing the material of the hollow article may be achieved.

The apparatus may comprise a fixture which holds the hollow article in place during the whole operation (i.e., loading-processing-unloading) and which preferably is designed to fit the individual workpiece in a way, that it covers areas on which no coating is desired.

The apparatus may further comprise an anode, which can consume electrons emitted by the plasma source. The anode may be a separate part of the apparatus, or a grounded wall or other component of the vacuum chamber. However, also the hollow article itself, being grounded or connected to a pulsed bias voltage, may be suitable as anode.

In one embodiment, the anode may be designed such that it can be introduced into the interior of the hollow article. Such auxiliary anode may be used to serve one or more of the following purposes: stabilize the deposition process; extract electrons from the deposition process; increase the energy of electrons in the process; realize depositions of non-conductive materials; limit and/or confine the deposition area; manage the temperature of the hollow article; introduce additional process gases.

Process gases supplied to the plasma via the gas supply channel may be selected from one or more of the following list: hydrogen, argon, helium, krypton, neon, xenon, nitrogen, oxygen, ammonia, methane, ethane, ethene, acetylene, hexane, monosilane, metal alkyls, metal alkyl amides, metal alkoxides, metal diketonates, metal carbonyls, metal cyclopentadienyls, metal halides.

The anode may also be arranged around the cathode, for example as a tubular anode, or in any other geometry next to the cathode.

The cathode and/or the anode may be realized with cooling elements, such as cooling channels.

In an embodiment, the apparatus may further comprise a plasma deflection unit having at least one magnetic field source. The plasma deflection unit may be used to influence the shape and density distribution of the plasma generated by the plasma source. By means of the modification of the plasma density the direction and flux of evaporated target atoms may be influenced in order to steer the deposition of material towards the desired area. A direct line-of-sight may therefore not be necessary if the flightpath of atoms can be influenced by the magnetic field. In a specific embodiment, the plasma deflection unit may comprise a recess into which a hollow article can be introduced. In this case, the magnetic field source may be designed such that the plasma generated by the plasma source can be exposed to a magnetic field from different sides.

The plasma deflection unit may also be useful to increase the control over the coating thickness distribution in under-cut cavity geometries and irregular shaped cavities.

The magnetic field source of the plasma deflection unit may be realized as permanent magnet or electromagnetic coil or a combination thereof.

The optional plasma deflection unit may also be position-able around the hollow article to tune the ionization in the deposition process. In this case at least one coil or at least one permanent magnet may be placed near the hollow article.

Optionally, the apparatus of the invention may comprise at least one additional secondary plasma source. The secondary plasma source may have all features of the plasma source of the present invention. However, the secondary plasma source may not be identical to the first plasma source.

The secondary plasma source may be inserted into the interior of the hollow article. In case the hollow article having tubular shape, the secondary plasma source may be introduced into the interior of the hollow article from the opposite side as the plasma source. Even more than one secondary plasma source may be provided.

In general, the apparatus may not only be useful to form a coating on the inner surface of a hollow article, but alternatively or additionally for modifying the properties of the inner surface of a hollow article. Thus, the plasma generated by the plasma source may also be used for modification of the inner surface of a hollow article. Such modification may include etching (i.e., material removal from the surface) and/or plasma nitriding.

The present invention may also relate to the arrangement of a hollow article with an apparatus of the invention.

The invention may further relate to a method for forming a coating on and/or modifying the properties of the inner surface of a hollow article.

In the method, it may be provided that a plasma source, preferably a plasma source according to the invention, is introduced into the interior of a hollow article. The inner surface of the hollow article may then be treated, in particular coated, by means of the plasma source.

The coating may be derived from material evaporated from a target of the plasma source and/or from gaseous material being supplied to the plasma and decomposed by the plasma.

In order to achieve a high-density plasma, the formation of a thermionic emission process is beneficial. This can be achieved by emitting electrons from a surface maintained at high temperature. Therefore, unmasked part of the plasma source, i.e., the plasma formation area, should be maintained at elevated temperatures.

This is preferably achieved in a step sequence. In a first step, the heating of the plasma formation area may be performed. This may be achieved by applying a pulsed or unpulsed electric field across the cathode. Since most of the plasma source is covered by the masking, no plasma is created around the masked area and the created plasma is present only in the plasma formation area. By this technique targeted heating of the cathode may be achieved.

Once the suitable temperature is achieved, in a second step thermionic electrons can be emitted and the high-density plasma can be maintained. Maintaining of the plasma usually takes place at a lower voltage as compared to igniting the plasma and/or heating the target.

In a preferred embodiment, the pressure in the gas supply channel, in particular the pressure at the gas outlet, is higher that the pressure in the vacuum chamber. This allows the formation of plasma having a confined shape.

The coating on the inner surface of the hollow article may be achieved by exposing the inner surface to the plasma discharge occurring in the plasma formation area, while the plasma source being arranged in an interior of the hollow article or in front of the cavity opening of the hollow article. The plasma source may be moved relative to the hollow article, in order to treat the inner surface of the hollow article over an extended length.

The plasma discharge may be locally created in the plasma formation area at the free end of the plasma source. The plasma may be maintained by electron emission from the surface of the target of the plasma source.

The material of the coating may originate from material of the target, which is evaporated from the target surface while the vapor condenses on the substrate surface. Additionally or alternatively, the material of the coating may also originate from the gas phase by adding a reactive gas through the gas supply channel into the plasma discharge and condensing or partially condensing the reaction products as well as break-up products on the substrate. Also a combination of these two processes may lead to the formation of the coating.

The distribution of the coating thickness can be controlled by the power input into the plasma process, by the optional magnetic field of the plasma deflection unit, as well as by the movement of the plasma source relative to the hollow article, as well as the pressure of gases supplied during the treatment.

The possible coating materials comprise of but are not limited to nitride, oxide, carbide, boride, silicide or metallic compounds or elements. Exemplary material systems that are of particular interest include: metallic chromium, oxidation and/or corrosion- and/or wear-resistant metals or alloys, CrN, CrCN, AlClN, AlCrCN, AlN, AlCN, Ti, TiN, TiC, TiCN, TiAlN, TiAlCN, TiSIN, TiSiCN, Si, SiN, SiC, SiCN, SiO, AlSiO, AlO, AlCrO, AlON, AlCrON, CrO, CrON, MCrAlY, or C-based coatings (e.g., diamond-like carbon (DLC), amorphous carbon or ta-C). By either exchanging the target of the plasma source or by optionally using additional plasma sources coatings comprising of layers with different chemistries of the metallic sublattice can be realized. In general, the coating composition may be defined by the use of one or more plasma sources, different target materials, different process gases, pressures, temperatures and plasma parameters.

Optionally, a plasma cleaning or plasma etching process of the inner surface of the hollow article may be provided using the plasma created by the plasma source.

Optionally, a plasma nitriding step may be performed before or during the coating process by introducing nitrogen gas into the plasma.

During material deposition the substrate can be kept at a floating potential, depending on the properties of the plasma and the deposition process itself. In order to tune the properties of the deposited coating, a bias voltage may be applied to the substrate, which increases the ion-bombardment of the growing coating. The bias voltage may preferably be realized in an RF (radio frequency), DC (direct current), pulsed DC or bipolar pulsed mode.

The operation of the plasma source can be realized in a DC or pulsed mode, but is preferably realized in a bipolar operation mode in which the cathodic and anodic operation are periodically reversed. With this option it is possible to evaporate a single target, but optionally it is also possible to evaporate material from two or more different targets and therefore it is possible to achieve multicomponent coatings comprised of a mixture of at least two different target's materials as well as multilayer coatings from two or more materials. As in other described operation methods, optionally reactive gases can be added to the process.

The plasma process is preferably regulated to a power density below 10 $KW/cm^2$ in relation to the surface of the plasma formation area. Low power densities, such as about 20 $W/cm^2$ for Ti, may not be sufficient to evaporate material but sustain a continuous plasma discharge while increasing the power density leads to increased evaporation rates of the target material.

The method of the invention may include a step of heating the hollow article before depositing the coating. This may improve the material properties of the coating.

The method of the invention may include a step of cleaning the inner surface of the hollow article before depositing the coating. The cleaning step may particularly be a plasma cleaning step, where a gas, for example an inert gas, such as a noble gas, or a reactive gas, such as hydrogen, is introduced into the vacuum chamber. The gas may be introduced to a partial pressure of between 0.1 and 100 Pa.

A plasma may then be ignited directly on the hollow article, which acts as a hollow cathode. A bias voltage can be applied to the hollow article to accelerate the created ions to achieve sufficient kinetic energy of the bombarding species in order to facilitate a material removal.

Optionally, if a more intense material removal rate is required, a plasma etching process can be further enhanced by adding the plasma source itself as the source of a thermionic electrons.

To enhance or modify the properties of the coatings or the properties of the deposition process itself, the coating may be doped with additional elements. Thus, the final coating arranged on the inner surface of the hollow article may contain less than 20% by weight of the doping elements.

The doping may be realized by the use of at least one of the following: a secondary plasma source equipped with a target comprising at least one doping element; an auxiliary anode comprising at least one doping element; the addition of at least one doping element as a gaseous precursor through the gas supply channel; selectively alloying the target with the doping element.

Doping elements can be one or more selected from the following list: boron, aluminum, cerium, chromium, gallium, indium, phosphorus, arsenic, antimony, bismuth, lithium, germanium, silicon, xenon, molybdenum, niobium, nitrogen, oxygen, carbon, gold, silver, titanium, tungsten, platinum, promethium, samarium, europium, gadolinium, terbium, dysprosium, holmium, erbium, thulium, ytterbium, lutetium.

The present invention can optionally be implemented into a conventional PVD system in which the coating on inner surfaces is realized with a plasma source in accordance with the invention, while a coating on the outer surfaces of the workpiece is realized preferably with conventional PVD coating sources. This optional process combination can preferably be realized in a single process, but all combinations that separate the two individual process segments either spatial (e.g., by providing a second chamber) and/or temporal (e.g., by providing a second process step) are possible.

The present invention may also relate to a hollow article having a coating on its inner surface, wherein the coating has been formed by an apparatus and/or a method of the present invention.

The invention optionally relates to an apparatus for forming a coating on and/or modifying the properties of the inner surface of a hollow article, wherein the apparatus comprises a plasma source, the plasma source having an elongate shape and comprising a cathode as well as a target, wherein the target is a thermionic electron emission source, and wherein the target is connected to the cathode in an electrically conductive manner.

It may be provided that the plasma source further comprises a masking which partially covers the outer surface of the cathode and the target, and which masking is adapted to prevent the formation of plasma on an area covered by the masking during operation of the apparatus, wherein a plasma formation area is provided on the target, which plasma formation area is not covered by the masking.

It may be provided that the target is hollow.

It may be provided that the target has an essentially tubular shape, and wherein the plasma formation area comprises a ring-shaped portion, which is preferably positioned at a free end of the plasma source.

It may be provided that the masking completely covers the outer surface of the cathode and the target, except for the plasma formation area not being covered by the masking.

It may be provided that the plasma source comprises a gas supply channel with a gas outlet being arranged at the plasma formation area.

It may be provided that the gas outlet is arranged within the plasma formation area.

It may be provided that the gas supply channel at the gas outlet has a cross sectional area of less or equal than 7 $mm^2$.

It may be provided that the masking is made of electrically insulating material.

It may be provided that the masking is made of electrically conductive material, with the masking not being connected to the cathode and the target in an electrically conductive manner.

It may be provided that the plasma source has a diameter of between 0.1 mm and 150 mm, and/or wherein the plasma source has a length of between 80 mm and 5000 mm.

It may be provided that the target consists of or comprises a material being selected from one or more of the following group: a metal, such as metallic chromium, or another oxidation and/or corrosion resistant metal; an alloy consisting of at least two different metals; a metal compound, such as a metal nitride, carbide, boride, oxide; a carbon-based compound, such as graphite It may be provided that the plasma source is arranged in a vacuum chamber, wherein the vacuum chamber is adapted to accommodate the hollow article.

It may be provided that the apparatus further comprises an anode being adapted to consume electrons emitted by the plasma source.

It may be provided that the apparatus further comprises a plasma deflection unit with at least one magnetic field source, in order to influence the shape of the plasma created by the plasma source, wherein the plasma deflection unit can be arranged in proximity to the hollow article.

It may be provided that the plasma deflection unit comprises a recess into which the hollow article can be introduced.

It may be provided that the cathode is integrally formed with the target, with the cathode and the target being made of the same material.

It may be provided that the cathode and the target are separate parts connected to each other, with the cathode and the target being made of the same or of different material.

The invention may also relate to a target for use and/or adapted for use in an apparatus according to the invention.

It may be provided that the target can be connected to the cathode in an electrically conductive manner.

The invention may also relate to an arrangement of an apparatus according to the invention with a hollow article, wherein the plasma source is inserted into an interior of the hollow article.

It may be provided that the hollow article is held by a fixture.

The invention may also relate to a method for forming a coating on and/or modifying the properties of the inner surface of a hollow article.

It may be provided that the method comprises the step of inserting a plasma source of an apparatus according to the invention into the interior of the hollow article.

It may be provided that the method comprises the step of generating a plasma by means of generation of thermionic electron emission from the cathode of the plasma source.

It may be provided that the method comprises the step of evaporating material from the target of the plasma source and/or decomposing gaseous precursors by means of the generated plasma.

It may be provided that the method comprises the step of depositing evaporated and/or decomposed material on the inner surface of the hollow article for forming the coating.

It may be provided that generating the plasma comprises the following steps: (i) igniting a plasma by applying a voltage of between 100 V to 1000 V to the cathode, (ii) sustaining the plasma by applying a discharge voltage of between 10 V and 500 V, wherein the surface of the target (4) is heated by the plasma, and wherein the voltage in the step of igniting the plasma is higher than in the step of sustaining the plasma.

It may be provided that the step of igniting the plasma comprises: (ia) a first ignition phase, where a pulsed high voltage is applied to the cathode, and (ib) a second ignition phase, where a direct current is applied to the cathode.

It may be provided that the hollow article is placed in a vacuum chamber of the apparatus, wherein the pressure in the vacuum chamber is below 500 Pa.

It may be provided that the pressure in a gas supply channel of the plasma source is higher than in the vacuum chamber.

It may be provided that the power density applied to the cathode is below 10 $KW/cm^2$ in relation to the size of the plasma formation area.

It may be provided that a stream of gas is supplied to the plasma formation area, wherein the gas is selected from one or more of the following: hydrogen; a noble gas; nitrogen; oxygen; ammonia; an alkane, such as methane; an alkene, such as ethane; an alkyne, such as acetylene; a silane, such as monosilane; a metal compound, such as an organometallic compound or a metal halide.

The invention may also relate to a hollow article having a coating on its inner surface, wherein the coating has been formed by an apparatus according to the invention and/or a method according to the invention.

Further features of the present invention can be derived from the claims, the drawings, and the following detailed description of exemplary embodiments according to the present invention.

In the following, the present invention will be explained in detail with reference to exemplary embodiments of the inventive aspects. The exemplary embodiments are not intended to limit the scope of protection, which is solely defined by the features of the independent claims.

Figure 1:
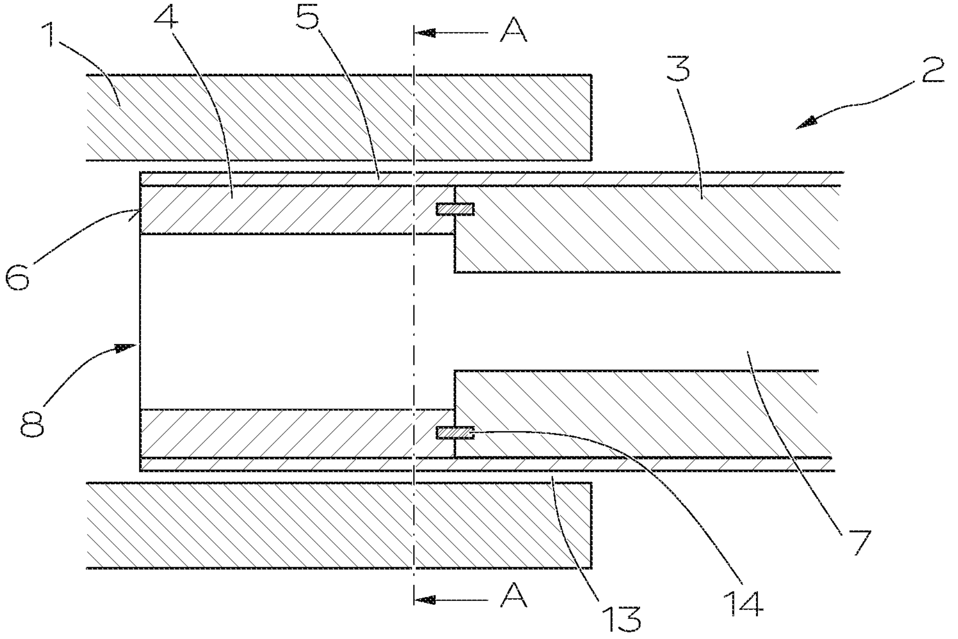
FIG. 1 shows a schematic sectional view of a plasma source of an apparatus according to a first exemplary embodiment, with the plasma source being arranged in a hollow article.

Unless otherwise noted, the drawings generally show the following features: hollow article 1, plasma source 2, cathode 3, target 4, masking 5, plasma formation area 6, gas supply channel 7, gas outlet 8, vacuum chamber 9, anode 10, plasma deflection unit 11, recess 12, interior 13, connection means 14.

FIG. 1 shows a schematic sectional view of a plasma source 2 of an apparatus according to a first exemplary embodiment of the present invention, with the plasma source 2 being arranged in a hollow article 1.

The plasma source 2 has an essentially tubular, elongate shape and comprises a cathode 3 and a target 4 being connected to the cathode 3 in an electrically conductive manner. The connection between cathode 3 and target 4 is achieved by connection means 14, which are designed as pins, in order to obtain a positive-locking connection between the two parts.

The cathode 3 and the target 4 are covered by a masking 5, which in this embodiment is made of electrically non-conductive material. The free end of the plasma source 2, in particular a part of the target 4 at the free end of the plasma source 2, is not covered by the masking 5.

While the masking 5 serves the purpose of preventing plasma in areas being covered by said masking 5, plasma can be formed in areas which are not covered by the masking 5. The latter area is therefore referred to as plasma formation area 6. In the present embodiment, the target 4 is of tubular shape and the masking 5 completely covers the circumferential outer surface of the target 4. Thus, the plasma formation area 6 has a ring-shape.

The plasma source 2 of the first embodiment has a gas supply channel 7 positioned in the central part of the cathode 3 and the target 4, with a gas outlet 8 being positioned at the free end of the plasma source 2.

In FIG. 1 the plasma source 2 is arranged in the interior 13 of a hollow article 1, which in this example is a tube.

Figure 2:
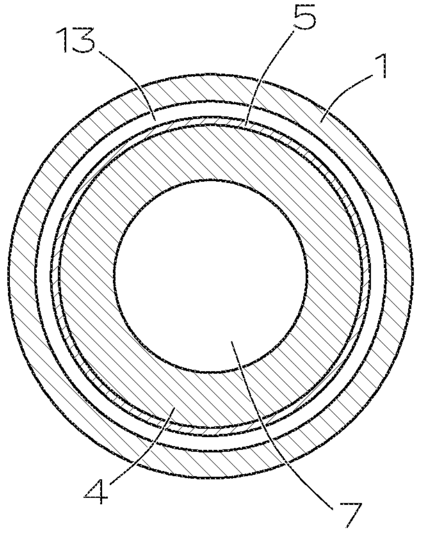
FIG. 2 shows a schematic sectional view across plane A-A of FIG. 1.

FIG. 2 shows a schematic sectional view across plane A-A of FIG. 1, with sections of the hollow article 1, the target 4, the masking 5, as well as the interior 13 of the hollow article 1 and the gas supply channel 7 being shown.

Figure 3:
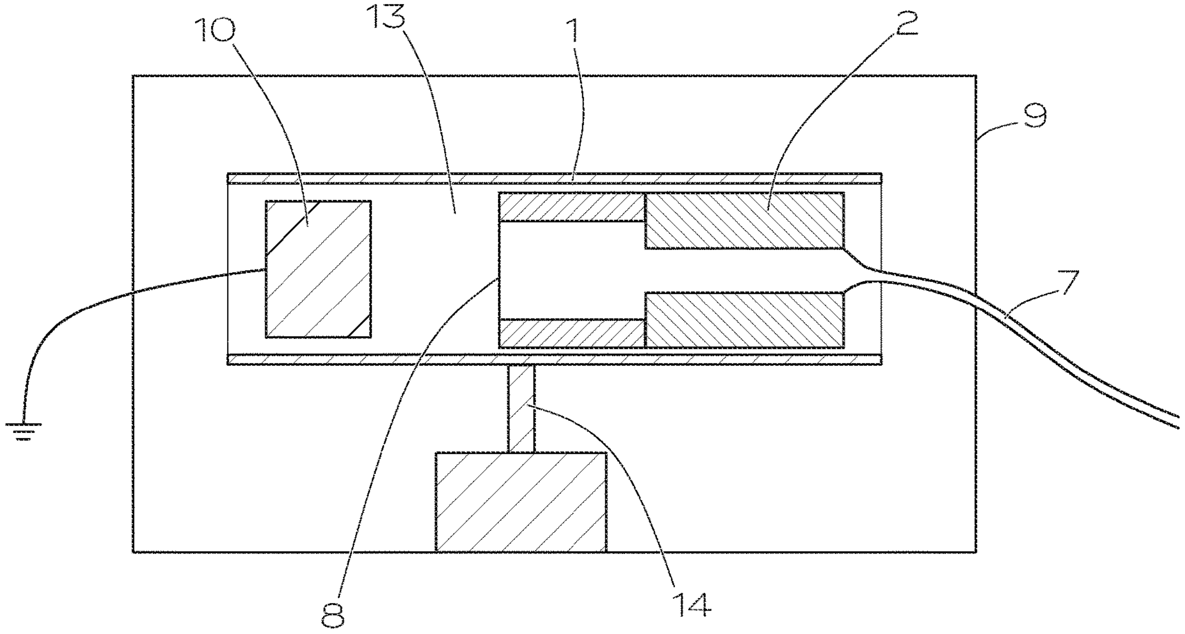
FIG. 3 shows a schematic overview of the apparatus according to the first exemplary embodiment.

The function of the apparatus according to the first exemplary embodiment is further elucidated with respect to FIG. 3, which shows a schematic overview of the apparatus. Apart from the features described in relation to FIGS. 1 and 2, the apparatus further comprises a vacuum chamber 9, an anode 10, and a fixture 14.

The vacuum chamber 9 accommodates the hollow article 1, as well as the plasma source 2, such as to allow a controlled pressure regime being present during the deposition process. The fixture 14 holds the hollow article 1 in position. The anode 10 is used to take up electrons generated by the plasma source 2. In this embodiment, the anode 10 is grounded.

The gas supply channel 7 of the apparatus is connected to a gas supply (not shown), which is adapted to supply the desired gas. Along with the gas supply, a power supply (not shown) is provided, which is connected to a power supply unit (not shown). The power supply unit is adapted to supply power to the plasma source.

In this exemplary embodiment, the target 4 is made of elemental copper with a purity of approx. 99.95%. The target has an outer diameter of approx. 6 mm.

The apparatus of the first embodiment can be used in a method for coating the inner surface of a hollow article 1. In this example, the hollow article 1 is an approx. 1 m long pipe with an inner diameter of approx. 1 cm In an exemplary embodiment of the method, the hollow article 1 is placed on the fixture 14 inside the vacuum chamber 9.

Then, the gas pressure inside the vacuum chamber 9 is controlled to below 500 Pa.

The plasma process for treatment of inner surface of the hollow article 1 using the plasma source 2 is achieved by a thermionic arc emission from the target 4 while the coating deposition is facilitated by interaction of the emitted electrons with the process gas and by thermionic evaporation of target material.

When igniting the plasma, argon gas is introduced into the vacuum chamber 9 at a partial pressure of 8 Pa. The plasma is ignited by applying a voltage of approx. 450 V at pulsed voltage to the cathode 3 in a first ignition phase. The used frequency of the pulsed voltage is approx. 100 kHz with 50% alternation. In a second ignition phase, the power supply is switched to direct current supply, and the voltage is lowered to approx. 200 V in order to achieve a discharge current of approx. 0.44 A. For operation, the plasma is sustained by means of a discharge voltage of approx. 120 V with a discharge current of approx. 0.6 A. The electrons which are emitted from the target during operation play a dual role: Firstly, the electrons ionize the gas or vapor in the interior 13 of the hollow article 1. Secondly, they heat up the target 4. The material from surface of the heated target 4 is therefore evaporated, and this way material can be deposited onto the substrate internal surface.

The plasma source 2, with an outer diameter of approx. 9 mm is then moved through the interior 13 of the hollow article 1.

The material of the target 4 is evaporated by means of the plasma and deposited on the inner surface of the hollow article 1, thus obtaining a coating of metallic copper on the inner surface of the hollow article 1. By controlling the movement speed of the plasma source 2 throughout the interior 13 the desired coating thickness and thickness distribution can be controlled.

In an alternative example, the method can be performed as nitride coating process, when nitrogen is introduced via the gas supply channel 7. In this example, the target 4 of the example described above is exchanged by another target made of elemental titanium. Gaseous nitrogen reacts with the titanium in the deposition process and forms TiN.

The conditions for igniting and sustaining the plasma depend in particular on the material of the target 4. Proper selection of the condition lies fully within the knowledge of an ordinary skilled person.

Coatings manufactured by the method can comprise of at least one layer, which first layer directly adheres to the inner surface of the hollow article 1. By moving the plasma source 2 along the internal surface additional times, multilayer coatings with two or more layers can be manufactured. Between the deposition of each individual layer the target 4 itself, the plasma source 2, the process gas composition, or a combination thereof can optionally be exchanged to deposit multilayer coatings with coatings comprising of different compositions.

During the operation of the plasma source 2 the grounded anode 10 is used to consume electrons generated by the plasma. Use of the anode 10 is in particular useful for coatings with high electrical resistivity like oxides, as this can lead to high energy consumption, process instabilities, or reduced coating quality.

The anode 10 at least partially consumes the electrons which are emitted at the target 4 during the plasma discharge. Using the anode 10, it is possible to provide additional thermal management for the hollow article 1 by reducing the electron bombardment on the inner surface of the hollow article 1. Furthermore, use of an anode 10 allows depositing non-conductive coatings onto the inner surface of the hollow article 1. The anode 10 can be realized in a design where it enters the interior 13 of the hollow article 1 from the opening on an opposite side than the plasma source 2.

Other arrangements and/or designs for the anode 10 are as well possible. For example, if the cavity diameter allows, the anode 10 can enter through the same opening as the plasma source 2, or it may be realized as a cylindrical tube around the plasma source 2.

Figure 4:
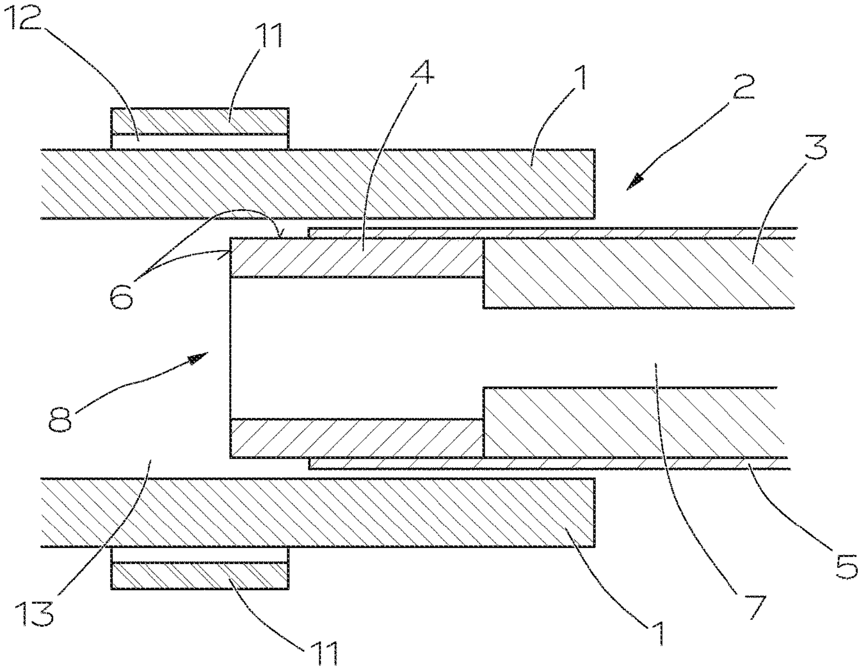
FIG. 4 shows a schematic sectional view of a plasma source of an apparatus according to a second exemplary embodiment, with the plasma source being arranged in a hollow article.

FIG. 4 shows a schematic sectional view of a plasma source 2 of an apparatus according to a second exemplary embodiment, with the plasma source 2 being arranged in a hollow article 1.

The plasma source 2 of the apparatus shown in FIG. 4 is similar to the one of the first embodiment, with the difference that the masking 5 does not completely cover the complete circumferential surface of the target 4, such that the plasma formation area 6 comprises the ring-shaped portion as in the first embodiment, but additionally the outer surface of the target 4, which is not covered by the masking 5.

In further contrast to the first embodiment, the cathode 3 and the target 4 are welded together.

Furthermore, the apparatus according to the second embodiment comprises a plasma deflection unit 11, comprising a magnetic field source. The plasma deflection unit 11 comprises a recess 12, into which the hollow article 1 can be guided.

This additional magnetic field may be used to influence the shape of the plasma generated by the plasma source 2. In this embodiment, the magnetic field source is an electromagnetic coil. The direction of the magnetic field controls the direction of the deflection of the plasma while the magnetic strength of the field controls the curvature of the track of the deflected electrons and subsequent ions. The magnetic field can further be used to fine-tune the properties of the growing coating films and the thickness distribution. Applying an external magnetic field will therefore allow to control the coating coverage on the internal surface of a substrate with an irregular geometry.

Many applications require multi-composite coatings. In some applications the desired metal components and their different phases are too dissimilar to achieve evaporation from a target 4 made of a single alloy. In a third exemplary embodiment, which is not shown in a corresponding drawing, a combination of at least two plasma sources 2 in accordance with the present invention is used.

The plasma sources 2 are equipped with targets 4 of different materials and they enter the interior 13 of the hollow article 1 opposite sides or the same cavity opening. Each additional plasma source 2 can optionally act as an anode or cathode. For example, the plasma source 2 can be used in a bi-polar pulsed mode. In this mode during the voltage pulse a negative voltage is applied to one of the plasma sources and a positive voltage is applied to the other plasma source. This means that the plasma source 2 to which the positive voltage is applied in fact acts as an anode 10 while the plasma source 2 to which the negative voltage is applied acts as a cathode 3 and evaporation of the material of the target 4 occurs.

After the voltage pulse ended the applied voltage can be reversed and evaporation from the other plasma source 2 occurs. At long pulse durations a type of multi-layer can be created while at short pulse durations the evaporation from both plasma sources 2 occurs in close enough temporal relation to allow the mixing of materials and subsequent deposition of multi composite coatings. This optional setup ensures that an anode 10 is always present inside the plasma discharge and therefore the emitted electrons can easily be extracted from the plasma discharge. This ensures stable plasma conditions for deposition of multi composite coatings.

The invention claimed is:

1. Apparatus for forming a coating on and/or modifying the properties of the inner surface of a hollow article (1), wherein the apparatus comprises a plasma source (2), the plasma source (2) having an elongate shape and comprising a cathode (3) as well as a target (4), wherein the target (4) is a thermionic electron emission source, and wherein the target (4) is connected to the cathode (3) in an electrically conductive manner, characterized in that the plasma source (2) further comprises a masking (5) which partially covers the outer surface of the cathode (3) and the target (4), and which masking (5) is adapted to prevent the formation of plasma on an area covered by the masking (5) during operation of the apparatus, wherein a plasma formation area (6) is provided on the target (4), which plasma formation area (6) is not covered by the masking (5).

2. Apparatus according to claim 1, wherein the target (4) is hollow.

3. Apparatus according to claim 1, wherein the target (4) has an essentially tubular shape, and wherein the plasma formation area (6) comprises a ring-shaped portion, which is positioned at a free end (10) of the plasma source (2).

4. Apparatus according to claim 1, wherein the masking (5) completely covers the outer surface of the cathode (3) and the target (4), except for the plasma formation area (6) not being covered by the masking (5).

5. Apparatus according to claim 1, wherein the plasma source (1) comprises a gas supply channel (7) with a gas outlet (8) being arranged at the plasma formation area (6), wherein the gas supply channel (7) at the gas outlet (8) optionally has a cross sectional area of less or equal than 7 $mm^2$.

6. Apparatus according to claim 1, wherein the masking (5) is made of electrically insulating material, or wherein the masking (5) is made of electrically conductive material, with the masking (5) not being connected to the cathode (3) and the target (4) in an electrically conductive manner.

7. Apparatus according to claim 1, wherein the plasma source (2) has a diameter of between 0.1 mm and 150 mm, and/or wherein the plasma source (2) has a length of between 80 mm and 5000 mm.

8. Apparatus according to claim 1, wherein the target (4) consists of or comprises a material being selected from one or more of the following group: a metal; an alloy consisting of at least two different metals; a metal compound; a carbon-based compound.

9. Apparatus according to claim 1, wherein the plasma source (2) is arranged in a vacuum chamber (9), wherein the vacuum chamber (9) is adapted to accommodate the hollow article (1).

10. Apparatus according to claim 1, further comprising an anode (10) being adapted to consume electrons emitted by the plasma source (2).

11. Apparatus according to claim 1, further comprising a plasma deflection unit (11) with at least one magnetic field source, in order to influence the shape of the plasma created by the plasma source (2), wherein the plasma deflection unit (11) can be arranged in proximity to the hollow article (1), the plasma deflection unit (11) optionally comprises a recess (12) into which the hollow article (1) can be introduced.

12. Apparatus according to claim 1, wherein the cathode (3) is integrally formed with the target (4), with the cathode (3) and the target (4) being made of the same material, or wherein the cathode (3) and the target (4) are separate parts connected to each other, with the cathode (3) and the target (4) being made of the same or of different material.

13. Arrangement of an apparatus according to claim 1 with a hollow article (1), wherein the plasma source (2) is inserted into an interior (13) of the hollow article (1).

14. Method for forming a coating on and/or modifying the properties of the inner surface of a hollow article (1), comprising the following steps:

inserting a plasma source (2) of an apparatus according to claim 1 into the interior (13) of the hollow article (1), generating a plasma by means of generation of thermionic electron emission from the cathode (3) of the plasma source (2), evaporating material from the target (4) of the plasma source (2) and/or decomposing gaseous precursors by means of the generated plasma, depositing evaporated and/or decomposed material on the inner surface of the hollow article (1) for forming the coating.

15. Method according to claim 14, wherein generating the plasma comprises the following steps:

igniting a plasma by applying a voltage of between 100 V to 1000 V to the cathode (3), sustaining the plasma by applying a discharge voltage of between 10 V and 500V, wherein the surface of the target (4) is heated by the plasma, and wherein the voltage in the step of igniting the plasma is higher than in the step of sustaining the plasma.

16. Method according to claim 15, wherein the step of igniting the plasma comprises:

a first ignition phase, where a pulsed high voltage is applied to the cathode (3), and a second ignition phase, where a direct current is applied to the cathode (3).

17. Method according to claim 14, wherein the hollow article (1) is placed in a vacuum chamber (9) of the apparatus, wherein the pressure in the vacuum chamber (9) is below 500 Pa, wherein the pressure in a gas supply channel (7) of the plasma source (2) is optionally higher than in the vacuum chamber (9).

18. Method according to claim 14, wherein the power density applied to the cathode (3) is below 10 $kW/cm^2$ in relation to the size of the plasma formation area (6).

19. Method according to claim 14, wherein a stream of gas is supplied to the plasma formation area (6), wherein the gas is selected from one or more of the following: hydrogen; a noble gas; nitrogen; oxygen; ammonia; an alkane; an alkene; an alkyne; a silane; a metal compound.

* * * * *